(12) United States Patent
Lo

(10) Patent No.: US 7,345,880 B2
(45) Date of Patent: Mar. 18, 2008

(54) HEAT SINK MODULE

(75) Inventor: Lieh-Feng Lo, Chung-Ho (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 99 days.

(21) Appl. No.: 11/431,401

(22) Filed: May 10, 2006

(65) Prior Publication Data
US 2007/0103873 A1 May 10, 2007

(30) Foreign Application Priority Data
May 11, 2005 (TW) .............................. 94207600 U

(51) Int. Cl.
*H05K 7/20* (2006.01)
*F28F 7/00* (2006.01)
*H01L 23/34* (2006.01)

(52) U.S. Cl. .................... 361/704; 165/80.3; 165/185; 257/718; 257/719; 361/710; 361/719

(58) Field of Classification Search ........ 257/718–719; 361/704, 719
See application file for complete search history.

(56) References Cited

U.S. PATENT DOCUMENTS

| | | | | |
|---|---|---|---|---|
| 5,353,863 A * | 10/1994 | Yu | ............................ | 165/80.3 |
| 6,246,584 B1 * | 6/2001 | Lee et al. | .................... | 361/704 |
| 6,470,962 B1 * | 10/2002 | Pao | ............................ | 165/80.3 |
| 6,477,050 B1 * | 11/2002 | Herring et al. | ............. | 361/704 |
| 7,239,518 B2 * | 7/2007 | Yang et al. | .................. | 361/704 |
| 7,272,007 B2 * | 9/2007 | Lee et al. | .................... | 361/704 |
| 2003/0159819 A1 * | 8/2003 | Lee | ............................ | 165/185 |
| 2005/0180114 A1 * | 8/2005 | Zhou et al. | ................. | 361/704 |
| 2006/0120053 A1 * | 6/2006 | Lee et al. | .................... | 361/704 |

* cited by examiner

*Primary Examiner*—Gregory D Thompson
(74) *Attorney, Agent, or Firm*—Alan Kamrath; Kamrath & Associates PA

(57) ABSTRACT

A heat sink module has a heat sink, two arms and two fasteners. The arms are slidably mounted respectively in the heat sink to slide along pivotally to move to a certain position on a circuit board. The fasteners respectively extend through the arms and are fastened in the certain position on the circuit board to hold the heat sink on the circuit board. Because the heat sink only needs the arms and the fasteners to be held securely on the circuit board, the manufacturing and assembling procedures are effectively reduced.

10 Claims, 5 Drawing Sheets

HEAT SINK MODULE

BACKGROUND OF THE INVENTION

1. Field of the Invention

The present invention relates to a heat sink module, especially to a heat sink module that is mounted on a chip on a circuit board.

2. Description of the Prior Arts

Heat sink modules are used to dissipate heat from and lower the temperature of circuit boards, especially the temperature of chips on the circuit boards. A conventional heat sink module comprises a heat sink and a fastening assembly. The heat sink has multiple fins and is attached to a chip. The fastening assembly is attached to the heat sink to connect the heat sink to the circuit board. A fan is mounted on the heat sink. Heat generated by the chip is dissipated by the heat sink and is blown away from the immediate ambient environment by the fan. With reference to FIG. 5, a conventional heat sink (50) has a bottom surface and two slots (51). The slots (51) are formed in the bottom surface opposite to each other, and each slot (51) has an opening (511) formed through the bottom surface. A conventional fastening assembly comprises two sliding connectors (60), two L-shaped mounting arms (70), two screws (80) and two fasteners (90). The sliding connectors (60) are slidably mounted respectively in the slots (51), and each sliding connector (60) has a central threaded hole. Each mounting arm (70) has an inner through hole (71) and an outer through hole (72) formed respectively in the ends of the arm (70). The inner through hole (71) corresponds to the sliding connector (60). The screws (80) extend respectively through the inner through holes (71) and screw respectively into the central threaded holes in the sliding connectors (60) to hold the mounting arms (70) and the sliding connectors (60) together. The fasteners (90) extend respectively through the outer through holes (72) and fasten the mounting arms (70) to a circuit board. As described, the conventional fastening assembly has many components to connect the heat sink to the circuit board.

To overcome the shortcomings, the present invention provides a heat sink module with an improved fastening device to mitigate or obviate the aforementioned problems.

SUMMARY OF THE INVENTION

The main objective of the present invention is to provide a heat sink module with an improved fastening device. The heat sink module has a heat sink, two arms and two fasteners. The arms are slidably mounted respectively in the heat sink to slide along pivotally to move to a certain position on a circuit board. The fasteners respectively extend through the arms and are fastened in the certain position on the circuit board to hold the heat sink on the circuit board. Because the heat sink only needs the arms and the fasteners to be held securely on the circuit board, the manufacturing and assembling procedures are effectively reduced.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
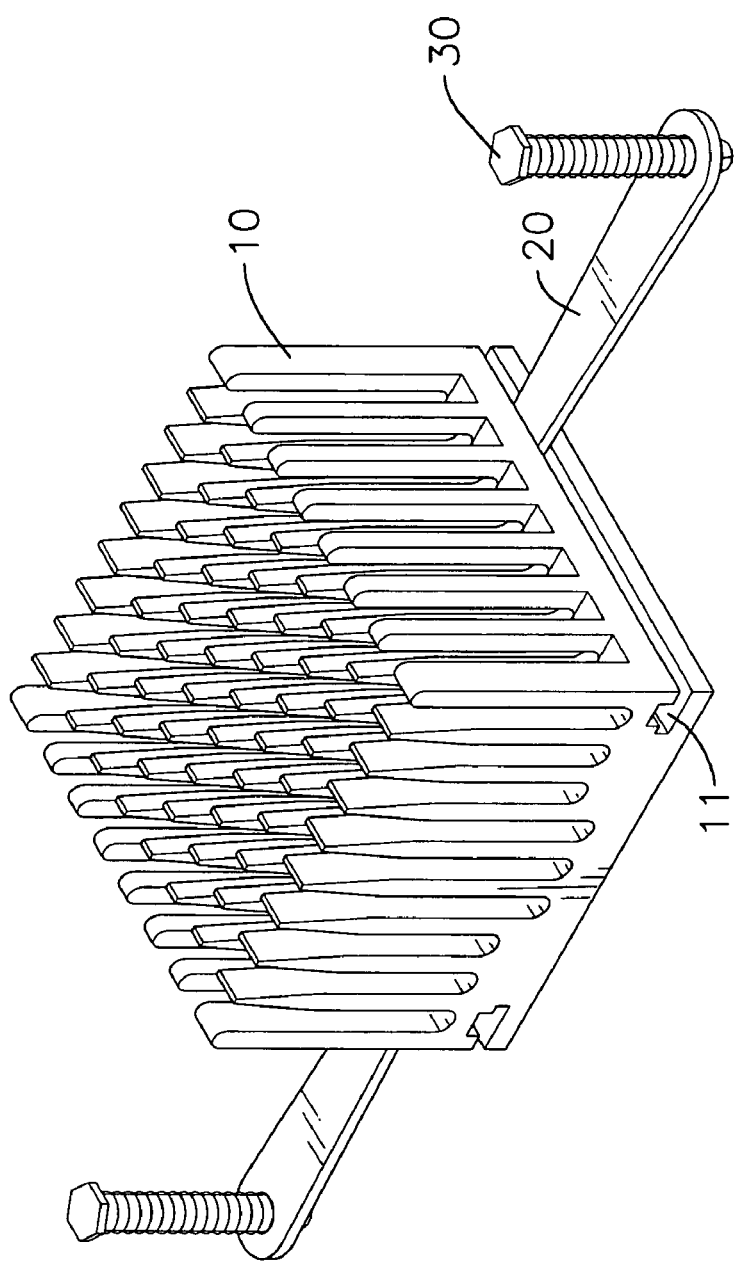
FIG. 1 is a perspective view of a heat sink module in accordance with the present invention.
Figure 2:
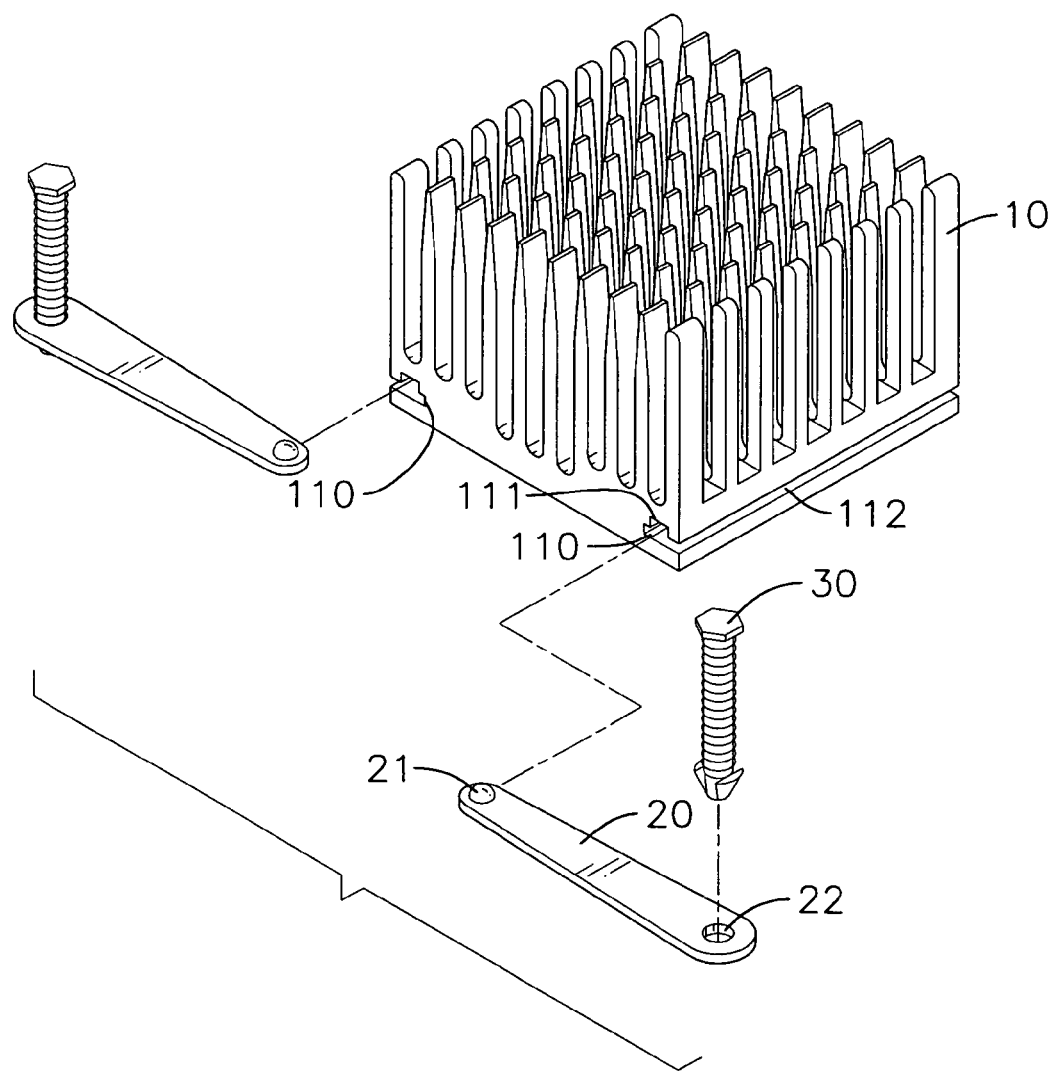
FIG. 2 is an exploded perspective view of the heat sink module in FIG. 1.

With reference to FIGS. 1 and 2, a heat sink module in accordance with the present invention comprises a heat sink (10), two arms (20) and two fasteners (30).

The heat sink (10) has a top surface, a bottom surface, two side surfaces, multiple fins, two main slots (110) and two secondary slots (111). The fins are formed on the top surface. The main slots (110) are formed respectively in the side surfaces. The secondary slots (111) are formed oppositely in the heat sink (10) near the side surfaces and respectively correspond to and communicate with the main slots (110). The secondary slots (111) are narrower than the main slots (110). The main slot (110) and the corresponding secondary slot (111) can form a T-shaped slot (11), and each T-shaped slot (11) has an opening (112) formed through the side surface.

The arms (20) are mounted slidably in the heat sink (10), and each arm (20) has an inner end, an outer end, a pawl (21) and a through hole (22). The inner and outer ends of the arms (20) are curve. The pawl (21) is on the inner end of the arm (20) and engages the corresponding secondary slot (111) in the heat sink (10). The pawls (21) can be a protrusion formed on the inner end of the arm (20) or a rivet extending through the inner end of the arm (20). The through hole (22) is formed in the outer end of the arm (20).

The fasteners (30) respectively extend through the through holes (22) in the arms (20). The fasteners (30) can be screws or bolts.

Figure 3:
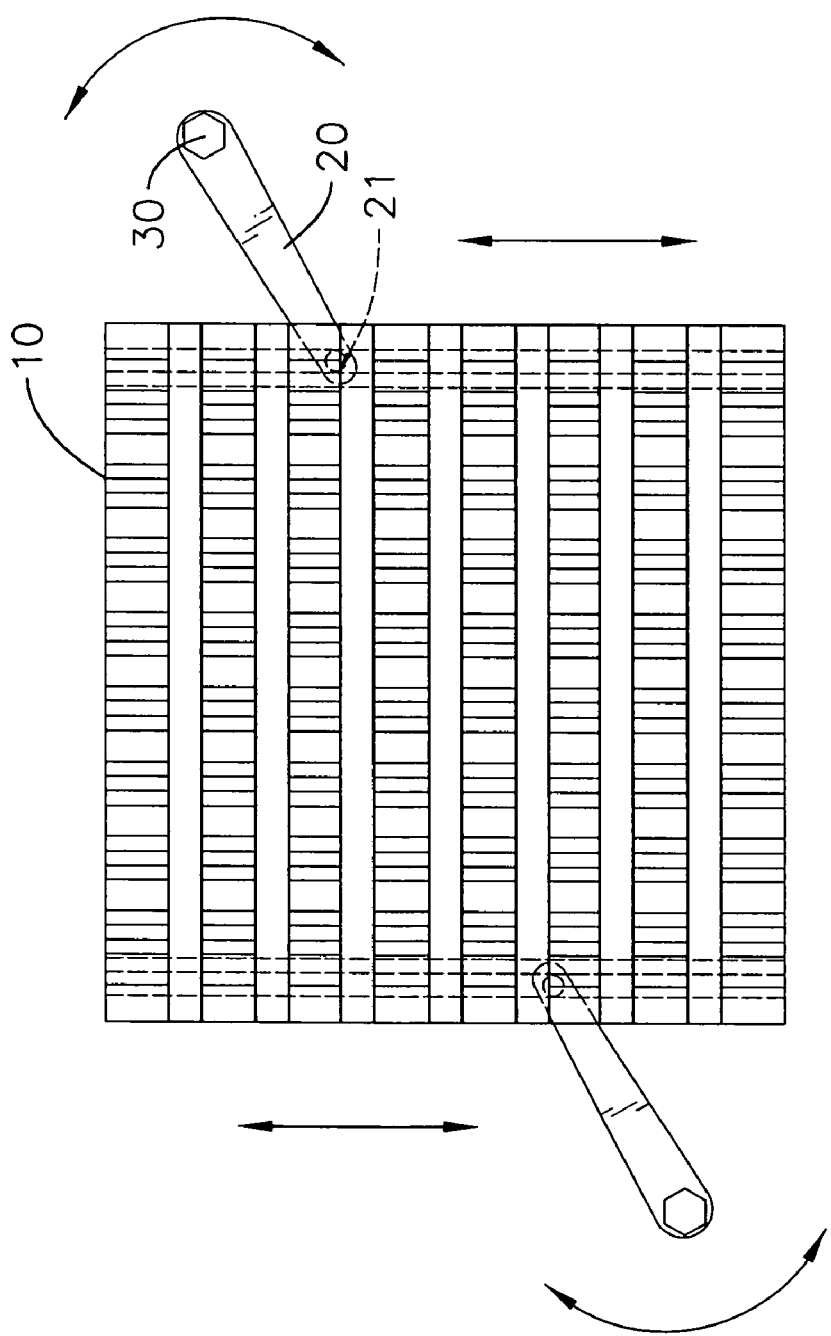
FIG. 3 is an operational top view of the heat sink module in FIG. 1.
Figure 4:
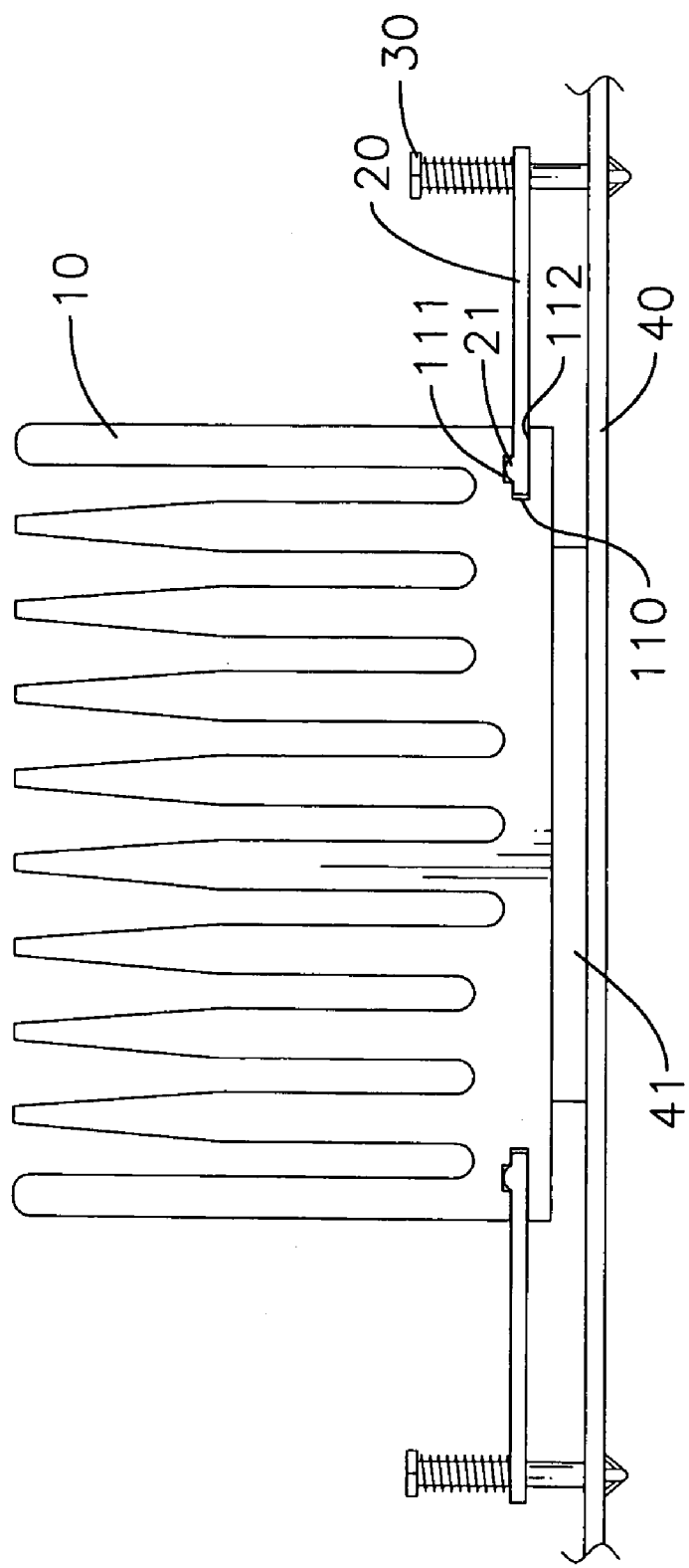
FIG. 4 is a side view of the heat sink module in FIG. 1.
Figure 5:
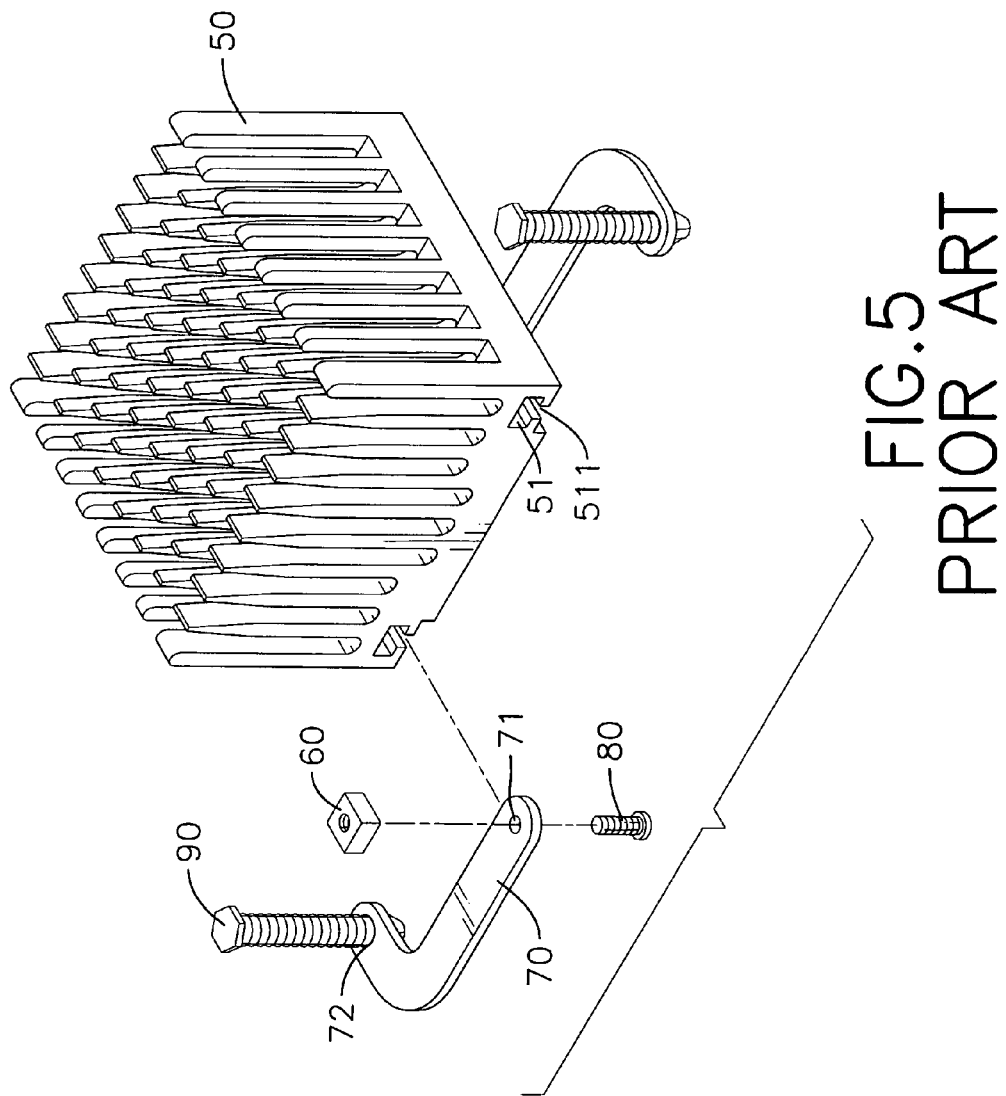
FIG. 5 is an exploded perspective view of a conventional heat sink with a conventional fastening device in accordance with the prior art.

With further reference to FIGS. 3 and 4, the heat sink (10) is attached to the chip (41) on the circuit board (40). The arms (20) are pivoted and slide along the heat sink (10) to move to the certain positions on the circuit board (40). The fasteners (30) are fastened in the certain positions on the circuit board (40) to hold the heat sink (10) on the circuit board (40). When the fasteners (30) are fastened in the circuit board (40), the arms (20) are curved.

Therefore, the heat sink module of the present invention only depends on two arms (20) and two fasteners (30) to hold securely on the circuit board (40). The components of the fastening device of the present invention are reduced. Thus, the manufacturing cost of the present invention is reduced and the assembling procedure is also simplified.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat sink module comprising:
   a heat sink comprising
      two side surfaces;

two main slots formed respectively one each in the side surfaces; and two secondary slots formed oppositely in the heat sink near the side surfaces and respectively one each corresponding to and communicating with a respective main slot, wherein the secondary slots are narrower than the main slots;

two arms mounted slidably in the heat sink, and each arm having an inner end;

an outer end;

a pawl on the inner end of each arm and engaging a corresponding secondary slot in the heat sink; and a through hole formed in the outer end of each arm; and two fasteners respectively one each extending through a respective thought hole in the arms.

2. The heat sink module as claimed in claim 1, wherein the inner and outer ends of the arms are curved.

3. The heat sink module as claimed in claim 1, wherein the pawl is a protrusion formed on the inner end of each arm.

4. The heat sink module as claimed in claim 1, wherein each fastener is a screw.

5. The heat sink module as claimed in claim 1, wherein each fastener is a bolt.

6. A heat sink module comprising:

a heat sink comprising two side surfaces; and two T-shaped slots formed one each in the side surfaces, and each T-shaped slot having an opening formed through the respective side surface;

two arms mounted slidably in the heat sink, and each arm having an inner end;

an outer end;

a pawl on the inner end of each arm and engaging a corresponding slot in the heat sink; and a through hole formed in the outer end of each arm; and two fasteners one each extending through a respective thought hole in the arms.

7. The heat sink module as claimed in claim 6, wherein the inner and outer ends of the arms are curved.

8. The heat sink module as claimed in claim 6, wherein the pawl is a protrusion formed on the inner end of each arm.

9. The heat sink module as claimed in claim 6, wherein each fastener is a screw.

10. The heat sink module as claimed in claim 6, wherein each fastener is a bolt.

* * * * *